United States Patent
Cho

(10) Patent No.: US 7,608,145 B2
(45) Date of Patent: *Oct. 27, 2009

(54) METHOD AND APPARATUS OF GROWING SILICON SINGLE CRYSTAL AND SILICON WAFER FABRICATED THEREBY

(75) Inventor: Hyon-Jong Cho, Gyeongsangbuk-do (KR)

(73) Assignee: Siltron Inc. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/773,669

(22) Filed: Jul. 5, 2007

(65) Prior Publication Data

US 2008/0053366 A1 Mar. 6, 2008

Related U.S. Application Data

(62) Division of application No. 11/285,750, filed on Nov. 22, 2005, now Pat. No. 7,371,283.

(30) Foreign Application Priority Data

Nov. 23, 2004 (KR) ................ 10-2004-0096209
Nov. 29, 2004 (KR) ................ 10-2004-0098530

(51) Int. Cl.
  *C30B 15/20* (2006.01)
(52) U.S. Cl. .............. 117/15; 117/13; 117/14; 117/30; 117/32; 117/929; 23/295 R; 423/328.2; 423/345
(58) Field of Classification Search ............. 117/13, 117/14, 15, 30, 32, 929; 23/295 R; 423/328.2; 423/345
See application file for complete search history.

(56) References Cited

U.S. PATENT DOCUMENTS

| 6,409,827 | B2 | 6/2002 | Falster et al. |
| 6,521,316 | B2* | 2/2003 | Lee et al. ............ 428/64.1 |
| 6,869,478 | B2* | 3/2005 | Nakamura et al. .......... 117/14 |
| 7,217,320 | B2* | 5/2007 | Kim et al. .............. 117/13 |

(Continued)

FOREIGN PATENT DOCUMENTS

KR   10200200230 A   3/2002

(Continued)

OTHER PUBLICATIONS

Correspondence issued on Jun. 28, 2006 from Korea Intellectual Property Office regarding corresponding Korean Application.

(Continued)

*Primary Examiner*—Felisa C Hiteshew
(74) *Attorney, Agent, or Firm*—LRK Patent Firm, LLC

(57) ABSTRACT

Disclosed is a method of fabrication of high quality silicon single crystal at high growth rate. The method grows silicon single crystal from silicon melt by Czochralski method, wherein the silicon single crystal is grown according to conditions that the silicon melt has an axial temperature gradient determined according to an equation, $\{(\Delta Tmax - \Delta Tmin)/\Delta Tmin\} \times 100 \leq 10$, wherein $\Delta Tmax$ is a maximum axial temperature gradient of the silicon melt and $\Delta Tmin$ is a minimum axial temperature gradient of the silicon melt, when the axial temperature gradient is measured along an axis parallel to a radial direction of the silicon single crystal.

15 Claims, 9 Drawing Sheets

U.S. PATENT DOCUMENTS 7,291,221 B2 * 11/2007 Korb .......................... 117/30
7,416,603 B2 * 8/2008 Cho ........................... 117/13

FOREIGN PATENT DOCUMENTS

| KR | 1020020023043 A | 3/2002 |
| KR | 10200240947 A | 5/2002 |
| KR | 10200281470 A | 10/2002 |
| KR | 10200359222 A | 7/2003 |
| KR | 10200456371 A | 6/2004 |
| KR | 10200360390 A | 9/2004 |
| KR | 10200553101 A | 6/2005 |

OTHER PUBLICATIONS

Correspondence issued Dec. 27, 2006from Korea Intellectual Property Office regarding corresponding Korean Application.

Correspondence issued on Jun. 28, 2006from Korea Intellectual Property Office regarding corresponding Korean Application.

* cited by examiner

METHOD AND APPARATUS OF GROWING SILICON SINGLE CRYSTAL AND SILICON WAFER FABRICATED THEREBY

CROSS-REFERENCE TO RELATED APPLICATIONS

The present application is a divisional of U.S. patent application Ser. No. 11/285,750, filed Nov. 22, 2005, the teachings of which are hereby incorporated herein by reference.

BACKGROUND OF THE INVENTION

1. Field of the Invention

The present invention relates to a method of growing high quality silicon single crystal, and more particularly, to a method and apparatus of growing a high quality silicon single crystal ingot by controlling temperature distribution of silicon melt during Czochralski growth of silicon single crystal, and silicone wafer fabricated thereby.

2. Description of the Related Art

As well known in the art, in order to grow a high quality silicon (Si) single crystal ingot that can enhance semiconductor device yield, temperature control has been conducted on high temperature distribution of the single crystal ingot mainly after crystallization. This methodology is intended to control stress that may be induced from contraction owing to cooling subsequent to crystallization or by the behavior of point defects built up in solidification.

According to a typical process of Czochralski growth of Si single crystal, polycrystalline Si is loaded into a quartz crucible where it is melted into Si melt under the heat radiated from a heater, and then a Si single crystal ingot is grown from the surface of Si melt.

When growing the Si single crystal ingot, the crucible is elevated the through the rotation of a shaft that supports the crucible, maintaining the solid-liquid interface to a constant level, and the Si single crystal ingot is wound up as rotated coaxially with the crucible but in reverse direction.

Generally, for the purpose of efficient growth of the Si single crystal ingot, inert gas such as argon Ar is blown into an ingot-growing apparatus via an upper portion thereof and exhausted from the ingot-growing apparatus via a lower portion thereof.

Conventional techniques for growing a Si single crystal ingot as above have used a heat shield and a water cooling pipe in order to control the temperature gradient of a growing Si single crystal. Examples of such conventional techniques include Korean Patent No. 374703, Korean Patent No. 0411571 and U.S. Pat. No. 6,527,859.

However, controlling the temperature gradient of single crystal is, by itself, not sufficient to manufacture a high quality Si single crystal ingot and a Si wafer having low point defect concentration.

In particular, in case of fabricating semiconductor devices from a Si wafer manufactured according to a conventional technique, micro precipitates are formed from point defects through repeated heat treatment in device fabrication. As a drawback, the micro precipitates cause faults, resulting in poor device yield.

As disclosed in U.S. Pat. Nos. 5,919,302, 6,287,380 and 6,409,826, the axial temperature distribution of crystal $G_0$ is in the form of $G_0 = c + ax^2$, making a tendency that vacancy concentration rises but interstitial concentration descends from the periphery to the center of a wafer. Unless sufficient out-diffusion takes place in vicinity to the wafer, interstitial crystal defects such as LDP occur. Subsequently, it is common practice to conduct crystal growth with high vacancy concentration in the center. Vacancy concentration, much higher than equilibrium concentration, tends to create vacancy-related crystal defects (e.g., void and Oxidation Induced Stacking Fault (OiSF)) in a central portion of the wafer. Besides, even though a void or OiSF region is controlled, micro precipitates may emerge from latent state through several heat treatments in semiconductor fabrication.

Other conventional techniques, which control the temperature distribution of single crystal in order to manufacture a high quality Si single crystal, are as follows: Japanese Patent Application No. Hei 02-119891 has been proposed to control the temperature distribution of the center and periphery of a Si single crystal ingot by adopting a hot zone during the cooling of the Si single crystal ingot in order to reduce lattice defects of the Si single crystal ingot owing to the strain of solidification. With this technique, in particular, the use of a cooling sleeve has enhanced solidification rate and reduced lattice defect in the growth direction of the Si single crystal ingot. Japanese Patent Application No. Hei 07-158458 has proposed to control the temperature distribution and the pulling speed of a crystal ingot, whereas Japanese Patent Application No. Hei 07-66074 has proposed to improve a hot zone and adjust cooling rate in order to control defect density. Japanese Patent Application No. Hei 04-17542 and U.S. Pat. No. 6,287,380 have proposed to change a hot zone and control cooling rate in order to restrict the formation of crystal defects by using the diffusion of point defects. Korean Patent Application No. 2002-0021524 discloses that improvement in a heat shield and a cooling pipe has enhanced the productivity of high quality single crystal. Japanese Patent Application Hei 05-61924 has proposed to periodically change the growth rate of crystal in order to utilize the hysteresis of a region having crystal defects such as OiSF and oxygen precipitation defect, thereby preventing crystal defects in a Si single crystal ingot.

However, these conventional techniques are based upon solid state reaction, and thus have the following problems: First, there are a number of hindrances to achieve an aim of high quality Si single crystal. For example, U.S. Pat. No. 6,287,380 is aimed to sufficiently diffuse supersaturated point defects in a high temperature region before growing them into crystal defects in order to drop point defect concentration. However, temperature has to be maintained up to 16 hours or more for this purpose, and thus this technique can be realized only theoretically but not in actual use.

Second, nearly all the conventional techniques have failed to have a practical effect. When a 200 mm diameter Si single crystal ingot was grown by periodically varying the pulling speed of the crystal ingot as proposed by Japanese Patent Application Hei 05-61924 and Eidenzon et al (Defect-free Silicon Crystals Grown by the Czochralski Technique, Inorganic Materials, Vol. 33, No. 3, 1997, pp. 272-279), aimed high quality was not achieved but stability in process was incurred to the contrary.

Third, those inventions based upon solid state reaction cannot achieve high productivity. Even though a heat shield and a water-cooling pipe were designed in optimal conditions according to the Korean Patent Application No. 2001-7006403, this arrangement merely showed low productivity and pulling speed for high quality single crystal was actually about 0.4 mm/min.

Another conventional technique for producing high quality Si single crystal is to control solid-liquid interface (crystal growth interface). Korean Patent Application No. 1998-026790 and U.S. Pat. No. 6,458,204 limit the profile of a solid-liquid interface for producing high quality Si single crystal. However, single crystal of sufficiently high quality was not produced in U.S. Pat. Nos. 5,919,302 and 6,287,380, even though they have a solid-liquid interface proposed by the above inventions.

Moreover, the foregoing conventional techniques showed low production yield in high quality single crystal.

SUMMARY OF THE INVENTION

The present invention has been made to solve the foregoing problems of the prior art and it is therefore an object of the present invention to provide a method and apparatus for growing high quality Si single crystal in which point defect concentration is microscopically controlled to such a degree that can eliminate faults in actual fabrication of devices.

It is another object of the invention to provide a method of growing high quality Si single crystal with high productivity.

It is further another object of the invention to provide a method of growing high quality Si single crystal with high yield.

In order to realize the foregoing technical objects, the invention has proposed to control the temperature distribution of Si melt during the Czochralski growth of Si single crystal in order to grow a high quality Si crystal ingot by microscopically controlling the generation of point defects.

The invention provides a method of growing a silicon single crystal from silicon melt by Czochralski method, wherein the silicon single crystal is grown according to conditions that the silicon melt has a temperature gradient determined according to an equation, $\{(\Delta T_{max}-\Delta T_{min})/\Delta T_{min}\} \times 100 \leq 10$, wherein $\Delta T_{max}$ is a maximum temperature gradient of the silicon melt and $\Delta T_{min}$ is a minimum temperature gradient of the silicon melt, when the temperature gradient is measured along an axis parallel to a radial direction of the silicon single crystal near the solid-liquid interface.

Preferably, the silicon single crystal is grown satisfying the above equation as well as following conditions that when the temperature of the silicon melt is measured along an axis parallel to a longitudinal direction of the silicon single crystal, the silicon single crystal is grown according to conditions that the temperature of the silicon melt measured starting with the solid-liquid interface rises gradually up to a hottest point and then descends gradually as getting away from the silicon single crystal, and the rising temperature gradient of the melt is kept larger than the descending temperature gradient of the melt.

Preferably, the axis is a central axis passing through the center of the silicon single crystal.

Preferably, the temperature gradient of the silicon melt measured along the axis parallel to the radial direction of the single crystal is taken a portion of the silicon melt ranging from the interface to the hottest point.

Preferably, the axis parallel to the longitudinal direction of the single crystal passes through the center of the silicon single crystal.

The hottest point may be positioned in a portion of the silicon melt corresponding to ⅕ to ⅔ of the total depth of the silicon melt from the surface, and preferably in a portion of the silicon melt corresponding to ⅓ to ½ of the total depth of the silicon melt from the surface.

The invention provides a method of growing silicon single crystal from silicon melt by Czochralski method, wherein the silicon single crystal is grown according to equation: $3 \leq Ln[Vs/Vc] \leq 5$, wherein Vc is a rotation speed of a crucible containing the silicon melt, and Vs is the rotation speed of the silicon single crystal.

It is preferable that the silicon single crystal is grown from the silicon melt under magnetic field. More preferably, the magnetic field is applied to the silicon melt in a direction vertical or horizontal to the longitudinal direction of the single crystal, or in CUSP type.

Also, a heater may be provided at sides of the silicon melt to heat the silicon melt so that heat generation in a portion of the silicon melt corresponding to ⅕ to ⅔ of the total depth of the silicon melt from the surface is increased over surrounding portions of the silicon melt.

The magnetic field can promote heat flow directed from a portion most adjacent to the heater toward the center of the solid-liquid interface or a high temperature region of the melt.

The invention also provides an apparatus for growing silicon single crystal from silicon melt by Czochralski method, the apparatus including: a chamber; a crucible provided inside the chamber, and containing silicon melt; a heater provided at sides of the crucible to heat the silicon melt so that heat generation in a portion of the silicon melt corresponding to ⅕ to ⅔ of the total depth of the silicon melt from the surface is increased over surrounding portions of the silicon melt; and a magnet provided at sides of the crucible to apply magnetic field to the silicon melt.

The apparatus of the invention may further include a heat shield provided between the silicon single crystal and the crucible, surrounding the silicon single crystal, in order to shield heat dissipation from the silicon single crystal; and a heat cover provided in the heat shield in a portion most adjacent to the silicon single crystal, surrounding the silicon single crystal.

The silicon wafer manufactured by the foregoing apparatus and method has point defect concentration that is the same as or less than critical saturation concentration of vacancies that is a minimum vacancy concentration allowing the formation of micro precipitates in heat treatment.

It is preferable that the heat treatment includes first heat treatment at 700 to 800□ for 5 to 7 hours and second heat treatment at 1000 to 1100□ for 14 to 18 hours. Preferably, the micro precipitates are formed inside the wafer at least 1□ deep from the surface of the wafer, and sized 0.3□ or less.

The invention also provides a silicon single crystal ingot grown by the foregoing apparatus and method and a silicon wafer obtained from the ingot have point defect concentration of $10^{10} \sim 10^{12}/cm^3$.

In the silicon single crystal ingot or wafer, it is preferable that an interstitial dominant region is a central portion and a vacancy dominant region is in a periphery.

Preferably, the point defect concentration is uniform so that a difference between a maximum point defect concentration (Cmax) and a minimum point defect concentration (Cmin) is 10% or less of the minimum point defect concentration (Cmin) in a region up to 90% or less of the diameter of the silicon single crystal ingot or wafer from the center.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Figure 1:
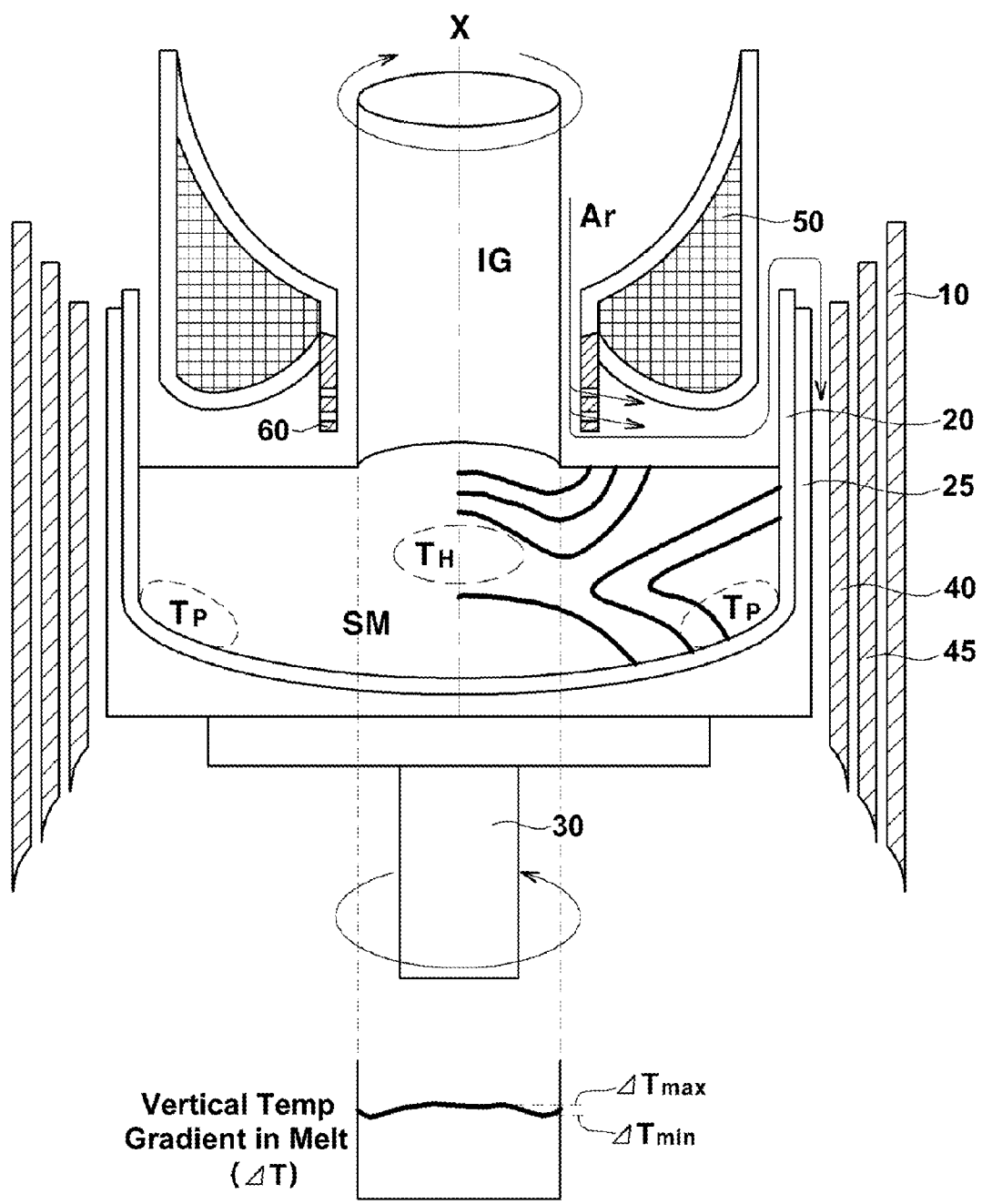
FIG. 1 is a schematic view illustrating a process of Si single crystal growth by Czochralski method according to an embodiment of the invention, with the axial temperature gradient profile of Si melt measured along an axis in parallel to the radial direction of a single crystal ingot.

Hereinafter, a preferred embodiment of the present invention will be described with reference to the accompanying drawings. In the following description and drawings, the same reference numerals are used to designate the same or similar components, and so repetition of the description on the same or similar components will be omitted.

The present invention starts from the conception that in growing solid Si single crystal from Si melt, the growth of a high quality Si single crystal ingot with minimized point defect is not obtained from merely controlling single crystal temperature gradient and solid-liquid interface profile, and is made based upon the fact that there exists a more decisive factor for the growth of a high quality Si single crystal.

In order to overcome restrictions in solid state reaction occurring in subsequent to crystallization, liquid state prior to solidification has been analyzed thoroughly, and as a result, it was found that the temperature distribution of Si melt is very important.

Crystal growth is generally carried out as growth units such as atoms or molecules migrate to a crystal growth interface or metastable region and the adhere to the interface, in which rising temperature gradient in Si melt increases driving force of the growth units in liquid state tending to migrate to the crystal growth interface or metastable region.

Herein the crystal growth interface is also referred to as crystallization interface or solid-liquid interface (or crystal-melt interface) where a solid Si single crystal ingot meets liquid Si melt. The metastable region refers to a status of liquid Si melt ready for solidification, which has incomplete crystallinity.

Since high temperature gradient in Si melt enhances growth units to participate in crystal growth, relatively low crystal-pulling speed causes excessive atoms to crystallize, thereby imparting self-interstitial rich characteristics to a Si single crystal ingot. On the contrary, relatively low temperature gradient in Si melt cannot provide a sufficient number of atoms to be crystallized, so that high crystal-pulling speed makes the Si single crystal ingot have a vacancy rich characteristic.

FIG. 1 is a schematic view illustrating a process of Si single crystal growth by Czochralski method according to an embodiment of the invention. As shown in FIG. 1, an apparatus for manufacturing a Si single crystal ingot according to the invention includes a chamber 10 where the Si single crystal ingot is grown.

A quartz crucible 20 containing Si melt SM is installed inside the chamber 10, and a crucible support 25 made of graphite is installed surrounding the quartz crucible 20.

The crucible support 25 is fixed on a rotary shaft 30, which is rotated by drive means (not shown) to turn and elevate the quartz crucible 20, thereby maintaining a solid-liquid interface to a predetermined level. The crucible support 25 is surrounded by a cylindrical heater 40 at a predetermined gap, and the heater 40 is surrounded by a barrel-shaped thermostat or heat insulator 45.

That is to say, the heater 40 is installed aside the quartz crucible 20 to heat high purity polycrystal Si lump loaded in the quartz crucible 20 into Si melt SM, and the heat insulator 45 prevents heat radiated from the heater 40 from dispersing toward the wall of the chamber 10 thereby to enhance heat efficiency.

Pulling means (not shown) is installed above the chamber 10 to wind up a cable, and a seed crystal is installed at a bottom of the cable in contact with the Si melt SM inside the quartz crucible 20 so that a Si single crystal ingot IG is grown by elevating the seed crystal through winding-up of the cable. The Pulling means carries out rotation while winding up the cable during the growth of the Si single crystal ingot IG, in which the Si single crystal ingot IG is raised while being rotated coaxially with the rotary shaft 30 of the crucible 20 but in reverse direction.

Inert gases such as Ar, Ne and N are supplied to the growing single crystal ingot IG and the Si melt SM via a top portion of the chamber 10, and used inert gas is exhausted out via a lower portion of the chamber 10.

A heat shield 50 is installed between the Si single crystal ingot IG and the crucible 20 to surround the ingot IG in order to prevent heat dissipation from the ingot IG. A cylindrical heat cover 46 is also attached to the heat shield 50 at a portion most adjacent to the Si single crystal ingot IG in order to further shield heat flow, thereby keeping heat.

The present invention is aimed to control the temperature of the Si melt SM to be uniform in the radial direction of the Si single crystal ingot IG.

In order to provide more detailed explanation, FIG. 1 shows isothermal lines marked in the Si melt SM together with a axial temperature gradient profile of the Si melt SM measured along an imaginary axis parallel to the radial direction of the Si single crystal ingot IG.

Examining the temperature of the Si melt SM in general, a highest melt temperature (designated with $T_P$ region in FIG. 1) is found in a lateral portion of the crucible most adjacent to the heater 40 as a heat source, and a lowest melt temperature is found as solidification temperature in a solid-liquid interface where crystal growth takes place.

In measurement of the temperature gradient of the Si melt SM along the axis parallel to the radial direction of the Si single crystal ingot IG, the temperature gradient is a vertical instantaneous gradient, which is preferably measured at the Si melt located under the Si single crystal ingot IG.

When the measured temperature gradient has a maximum ΔTmax and a minimum ΔTmin, the Si single crystal ingot IG is grown in conditions according to Equation (1) below:

$$\{(\Delta T\mathrm{max} - \Delta T\mathrm{min})/\Delta T\mathrm{min}\} \times 100 \leq 10 \quad (1)$$

Equation (1) implies that temperature is controlled so that the difference between the maximum temperature gradient ΔTmax and the minimum temperature gradient ΔTmin is 10% or less of the minimum temperature gradient ΔTmin. The temperature difference is preferably 5% or less, more preferably 3% or less, and further more preferably 1% or less.

If the temperature of the Si melt SM becomes ununiform in the radial direction of the Si single crystal ingot IG in such a degree that the difference between the maximum temperature gradient ΔTmax and the minimum temperature gradient ΔTmin exceeds 10% of the minimum temperature gradient ΔTmin, it is impossible to obtain high quality Si single crystal proposed by the invention. Since the temperature of the Si melt can be varied periodically under the influence of melt convection, mean value is preferably taken as the measured temperature.

The invention also proposes the existence of a high temperature region (marked with $T_H$ in FIG. 1) relatively hotter than surrounding regions within the melt, and particularly, to control the temperature gradient at top and bottom portions of the high temperature region $T_H$.

Figure 2:
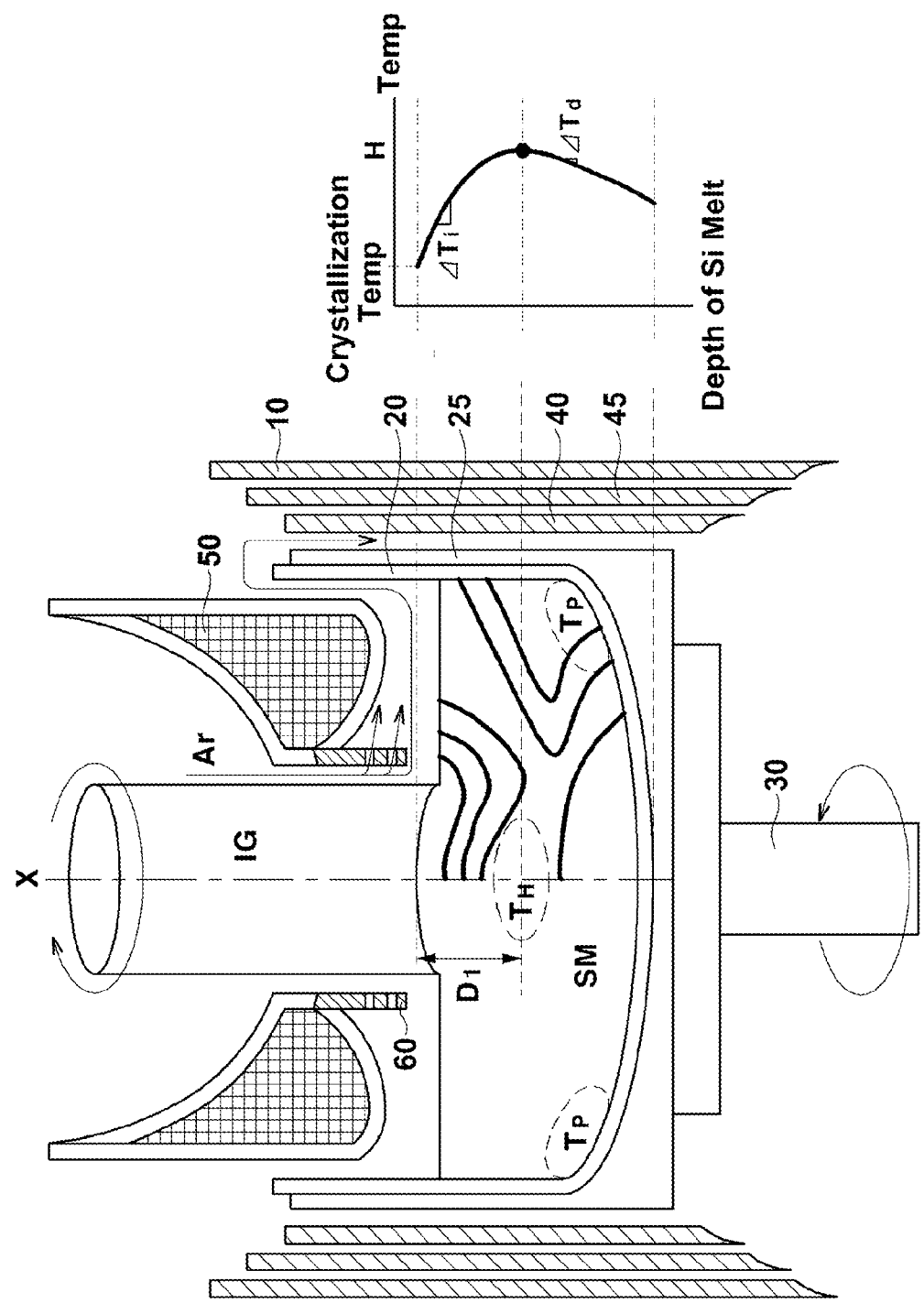
FIG. 2 is a sectional view illustrating a process of Si single crystal growth by Czochralski method according to an embodiment of the invention, with the temperature profile of Si melt measured along the longitudinal direction of a single crystal ingot.

In order to give a more detailed description, FIG. 2 shows a temperature profile of the Si melt measured along an axis X parallel to the longitudinal direction of the single crystal ingot.

When measuring the temperature of the Si melt SM along the axis parallel to the longitudinal direction of the single crystal ingot IG, the temperature of the Si melt SM measured starting with the solid-liquid interface rises gradually up to a hottest point H as getting away from the single crystal ingot IG and then descends gradually as getting away from the hottest point H toward the bottom of the Si melt SM, which is most remote from the single crystal ingot IG.

Preferably, the Si single crystal ingot IG is grown by maintaining a condition ΔTi>ΔTd, in which ΔTi is melt temperature gradient rising from the solid-liquid interface up to the hottest point H, and ΔTd is melt temperature gradient descending from the hottest point H to the melt bottom. The axis X as a reference of indicating temperature measurement position is preferably a central axis passing through the center of the Si single crystal ingot IG.

The hottest point H preferably exists at a point of about ⅕ to ⅔ of the total depth of the Si melt SM from the surface, and more preferably at a point of about ⅓ to ½ of the total depth of the Si melt SM.

More preferably, the single crystal ingot is grown by meeting Equation (1) above while keeping the condition ΔTi>ΔTd.

In case of measuring the temperature gradient of the Si melt mentioned in Equation (1) above along the axis parallel to the radial direction of the single crystal ingot, the temperature gradient of the Si melt is preferably measured at a melt region from the solid-liquid interface where crystal growth takes place to the level $D_1$ of the hottest point H.

The temperature gradient profile shown in FIG. 1 is measured at a point ⅕ deep from the surface of the Si melt SM.

In the invention, it was also found that the temperature distribution of the Si melt SM in the radial direction of single crystal is associated with the rotation speed of the crucible 20 containing the Si melt SM. Rotating the crucible containing the Si melt gives centrifugal force to the Si melt, in which centrifugal force F applied to the Si melt per unit volume is expressed as $F=mr\omega^2$, in which m is the mass of Si melt unit volume, r is the distance from the center axis, and ω is angular velocity applied to the Si melt per unit volume. The angular velocity ω may also be referred to as the rotation speed of the crucible. Other factors such as frictional force will not be considered owing to relatively low viscosity of the Si melt.

The centrifugal force F applied to the Si melt per unit volume increases linearly as Si melt position changes from the center of the single crystal ingot radially toward the periphery, and in proportion to the square of the rotation speed of the crucible.

Figure 3:
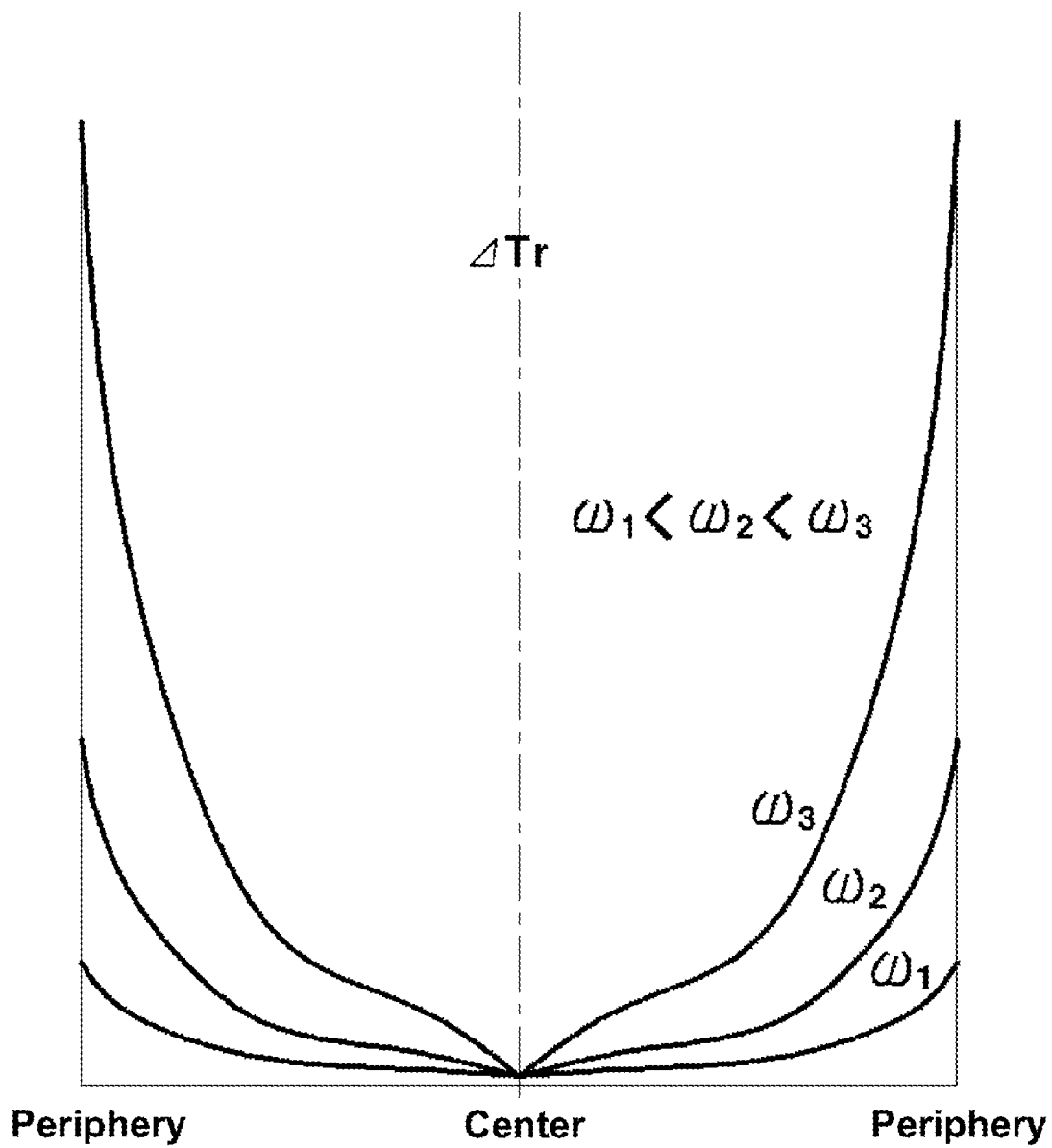
FIG. 3 is a graph showing the temperature difference of the melt ΔTr taken from the center toward the wall of the crucible in the radial direction, at ⅕ depth point of the Si melt.

FIG. 3 is a graph showing the temperature difference of the melt ΔTr taken from the center toward the wall of the crucible in the radial direction, at ⅕ depth point of the Si melt (from the surface).

It is apparent that the temperature difference of the melt ΔTr decreases according to a decrease in rotation speed of the crucible, that is, descending from curve $\omega_3$ to curve $\omega_1$, such that the temperature distribution of the melt becomes uniform in the radial direction.

As a result, in order to make the temperature of the Si melt uniform in the radial direction of single crystal, the rotation speed should drop as low as possible, for example, to 2 rpm or less, preferably to 1 rpm or less, and more preferably 0.6 rpm or less.

Figure 4:
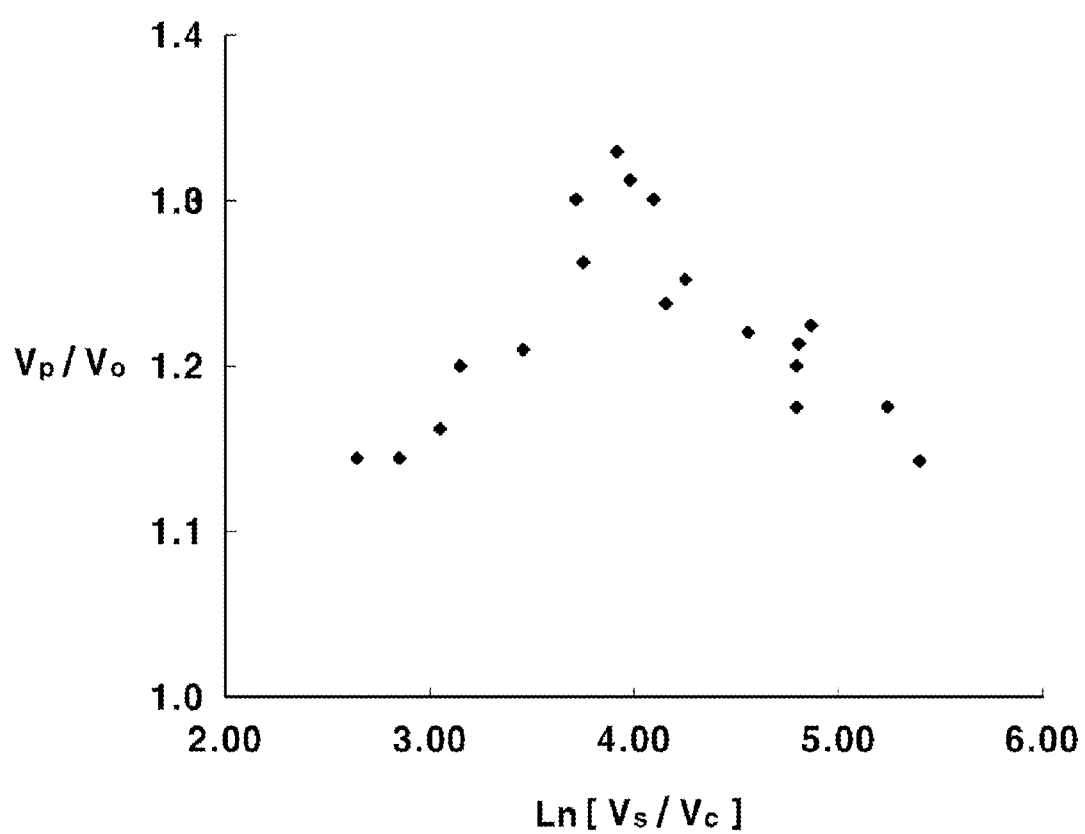
FIG. 4 is a graph showing the growth rate of the high quality silicon single crystal ingot with respect to log value Ln [Vs/Vc] obtained by the rotation speed of the crucible and the rotation speed Vs of the silicon single crystal ingot.

Furthermore, in order to manufacture high quality single crystal at high productivity, it is required to determine the operational range of the rotation speed of the single crystal ingot IG according to the rotation speed of the crucible 20. FIG. 4 is a graph showing the growth rate of the Si single crystal ingot with respect to log value Ln [Vs/Vc] obtained by the rotation speed of the crucible Vc and the rotation speed of the silicon single crystal ingot Vs. In the graph shown in FIG. 4, Vp indicates the growth rate of high quality single crystal according to the invention, and Vo indicates the growth rate of the prior art.

A tendency can be confirmed from the graph shown in FIG. 4 where the growth rate of high quality single crystal rises up to a predetermined range but descends past the predetermined range according to rising Ln [Vs/Vc] value. This originates from the fact as disclosed in Korean Patent Application No. 2003-0080998 that was previously filed by the inventor. That is, when single crystal rotates too fast compared to slow rotation of the crucible, cold melt rises up from the bottom of the crucible, thereby cooling the high temperature region, and thus dropping the axial temperature gradient of the melt. In addition, abnormal growth of crystal may take place if the temperature gradient of the melt becomes excessively small in the radial direction of single crystal in vicinity of triple point where single crystal (solid), melt (liquid) and atmosphere (gas) meet together. So, it is preferably to avoid such a value in case of setting Ln [Vs/Vc] value. Through these results, the invention has been made to grow Si single crystal under conditions according to Equation (2) below:

$$3 \leq Ln\ [Vs/Vc] \leq 5 \tag{2}$$

where Vc is the rotation speed of the crucible, and Vs is the rotation speed of single crystal.

As an alternative, the invention can make the temperature of the Si melt more uniform in the radial direction of single crystal by using magnetic field. That is, Si single crystal is grown from the Si melt under the magnetic field. Magnetic field may be applied to the Si melt vertically or horizontally to the longitudinal direction of single crystal, or CUSP magnetic field may be applied to the Si melt.

Figure 5:
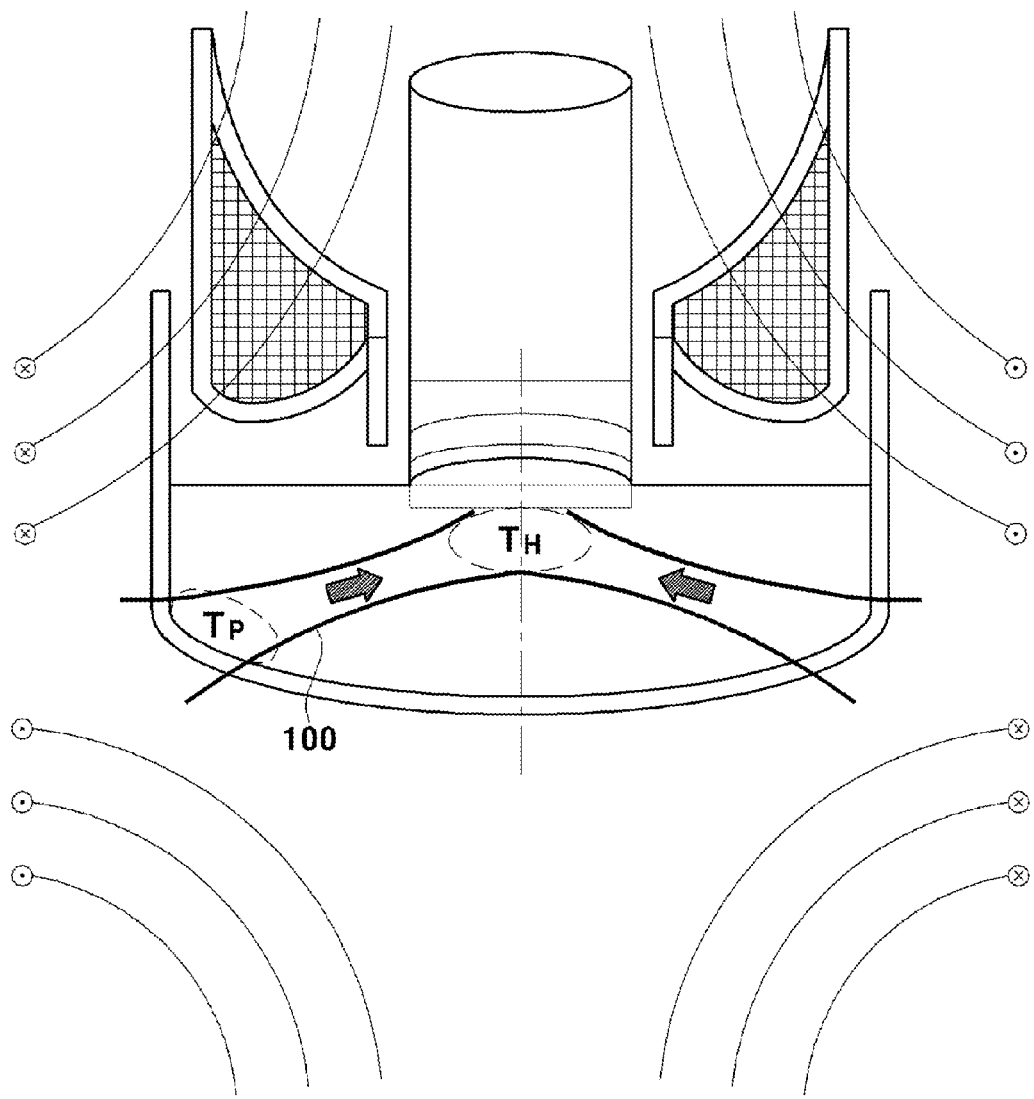
FIG. 5 is a schematic view illustrating a process of Si single crystal growth under magnetic field according to the invention.

FIG. 5 is a schematic view illustrating a process of growing Si single crystal under CUSP magnetic field, in which profiles of magnetic force lines are shown. Magnetic field controls the convention of the Si melt, and more particularly, restricts the flow of the Si melt in direction perpendicular to the magnetic force lines, thereby influencing heat flow. Accordingly, magnetic field applied to the Si melt promotes heat flow directed from the hottest region $T_P$ most adjacent to the heater toward the center of the solid-liquid interface or a hot region $T_H$ of the Si melt.

Since the magnetic field assists heat conduction from the hottest region $T_P$ to the hot region $T_H$, the temperature gradient of the melt on the rise or the temperature difference between the solid-liquid interface and the hot region $T_H$ becomes larger, thereby increasing the growth rate of high quality crystal.

In addition, the invention can improve the heater in order to produce the position of the hottest point H and the temperature gradient in the Si melt SM according to preset conditions. For example, the Si single crystal ingot can be grown by increasing heat generation from the heater 40 installed around the Si melt at portions corresponding to ⅕ to ⅔ of the total depth from the surface of the Si melt.

More preferably, heat generation from the heater 40 can be increased at portions corresponding to ⅓ to ½ of the total depth from the surface of the Si melt over surrounding portions.

For example, a heater using Joule's heat produced from current flowing through resistance wire can increase resistance in portions corresponding to ⅕ to ⅔, and more preferably, in portions corresponding to ⅓ to ½ of the total depth from the surface of the Si melt. The resistance of specific portions in the heater can be increased based upon a fact that resistance is proportional to specific resistance and length but inverse proportional to cross section, for example, by reducing the cross section of the resistance wire or using a heater material of high specific resistance.

Example 1 used an apparatus for growing Si single crystal as shown in FIG. 1, and increased the resistance of a heater portion corresponding to ⅕ depth from the melt surface.

The temperature of the Si single crystal ingot and the Si melt was measure with a thermocouple, and its results are reported in Tables 1 and 2 below.

After measuring the temperature difference between the solid-liquid interface and a single crystal point distanced 50 mm from the solid-liquid interface (expressed with crystal $\Delta T(50\ mm) = 1410°\ C. - T_{50\ mm}$), obtained by subtracting $T_{50\ mm}$ at the single crystal point distanced 50 mm from solid-liquid interface temperature 1410° C., and the temperature difference between the solid-liquid interface and a single crystal point distanced 100 mm from the solid-liquid interface (expressed with crystal $\Delta T(100mm) = 1410°\ C. - Ti_{100\ mm}$), their results are reported in Table 1, expressed in ratios with respect to reference values.

Table 2 reports measurement results of the temperature difference $\Delta T$ of the Si melt in depth, in which the temperature difference between the solid-liquid interface temperature 1410□ and melt temperature at several points corresponding to ⅕, ¼, ⅓, ½, ⅔, ¾ and ⅘ of the total depth of the Si melt from the surface were measured, and expressed in ratios with respect to reference values. For example, "melt $\Delta T$ (⅕ depth)" indicates a value produced by subtracting melt temperature at ⅕ depth point with respect to the total depth of the Si melt from 1410□, and expressed with a ratio about reference value LT⅕.

The results of Examples 1 to 3 and Comparative Examples 1 to 3 as shown in Tables 1 and 2 are values expressed in ratios with respect to reference values. The reference values indicate a temperature profile in which the temperature of the Si melt rises gradually as approaching the bottom of the crucible away from the solid-liquid interface but the gradient of rising temperature becomes smaller gradually.

TABLE 1

| Growth Condition | Crystal $\Delta T$ (50 mm) | Crystal $\Delta T$ (100 mm) |
| --- | --- | --- |
| Reference | ST50 | ST100 |
| Exam. 1 | 1.99 | 1.94 |
| Exam. 2 | 2.00 | 1.96 |
| Exam. 3 | 2.02 | 1.97 |
| Comp. Exam. 1 | 1.96 | 1.92 |
| Comp. Exam. 2 | 2.08 | 2.04 |
| Comp. Exam. 3 | 2.10 | 2.09 |

TABLE 2

| Growth Condition | Melt $\Delta T$ (at points with respect to depth) | | | | | | | High Quality Growth Rate (V) |
| --- | --- | --- | --- | --- | --- | --- | --- | --- |
| | ⅕ | ¼ | ⅓ | ½ | ⅔ | ¾ | ⅘ | |
| Reference | LT⅕ | LT¼ | LT⅓ | LT½ | LT⅔ | LT¾ | LT⅘ | V0 |
| Exam. 1 | 1.31 | 1.31 | 1.31 | 1.30 | 1.10 | 1.00 | 0.92 | 1.31 |
| Exam. 2 | 1.30 | 1.31 | 1.31 | 1.30 | 1.13 | 1.05 | 0.96 | 1.31 |
| Exam. 3 | 1.30 | 1.30 | 1.31 | 1.31 | 1.15 | 1.08 | 0.99 | 1.31 |
| Comp. Exam. 1 | 1.09 | 1.08 | 1.08 | 1.08 | 1.09 | 1.10 | 1.10 | 1.09 |
| Comp. Exam. 2 | 1.10 | 1.09 | 1.10 | 1.10 | 1.13 | 1.15 | 1.15 | 1.09 |
| Comp. Exam. 3 | 1.09 | 1.08 | 1.08 | 1.08 | 1.09 | 1.10 | 1.10 | 1.09 |

As shown in Table 2 above, in Example 1, the temperature of the Si melt rose gradually reaching about 1.3 times over the reference value at ⅕ depth point from the surface in a direction away from the solid-liquid interface, and reached the highest point after passing ½ depth point from the surface. The Si melt temperature descended gradually from the highest point meeting a point between ¾ depth and ⅘ depth—which has the same temperature as the reference value—and past this point, dropped under the reference value. In this case, rising temperature gradient was larger than descending temperature gradient, and Si single crystal was grown under the melt temperature conditions as mentioned above.

Example 2 used a growing apparatus the same as that of Example 1, with raised resistance of a heater portion corresponding to ⅓ depth point from the surface of the melt. The temperatures of a single crystal ingot and melt were measured, and their results are reported in Table 2 above.

Example 3 used a growing apparatus the same as that of Example 1, with raised resistance of a heater portion corresponding to ⅔ depth point from the surface of the melt. The temperatures of a single crystal ingot and melt were measured, and their results are reported in Table 2 above.

In Comparative Example 1, a Si single crystal ingot was grown according to a conventional technique that controls the temperature distribution of the ingot. The temperatures of the Si single crystal ingot and melt were measured, and their results are reported in Table 2 above.

In Comparative Example 2, a single crystal ingot was grown according to a conventional technique that applies strong horizontal magnetic field to control the solid-liquid interface profile of crystal growth to be convex toward the single crystal ingot as disclosed by Korean Patent Application No. 1998-026790. The temperatures of the single crystal ingot and melt were measured, and their results are reported in Table 2 above.

In Comparative Example 3, a 200 mm diameter Si single crystal ingot was grown according to a conventional technique that periodically changes the pulling speed of the crystal ingot as disclosed by Japanese Patent Application Hei 05-61924. The temperatures of the single crystal ingot and melt were measured, and their results are reported in Table 2 above.

Figure 6:
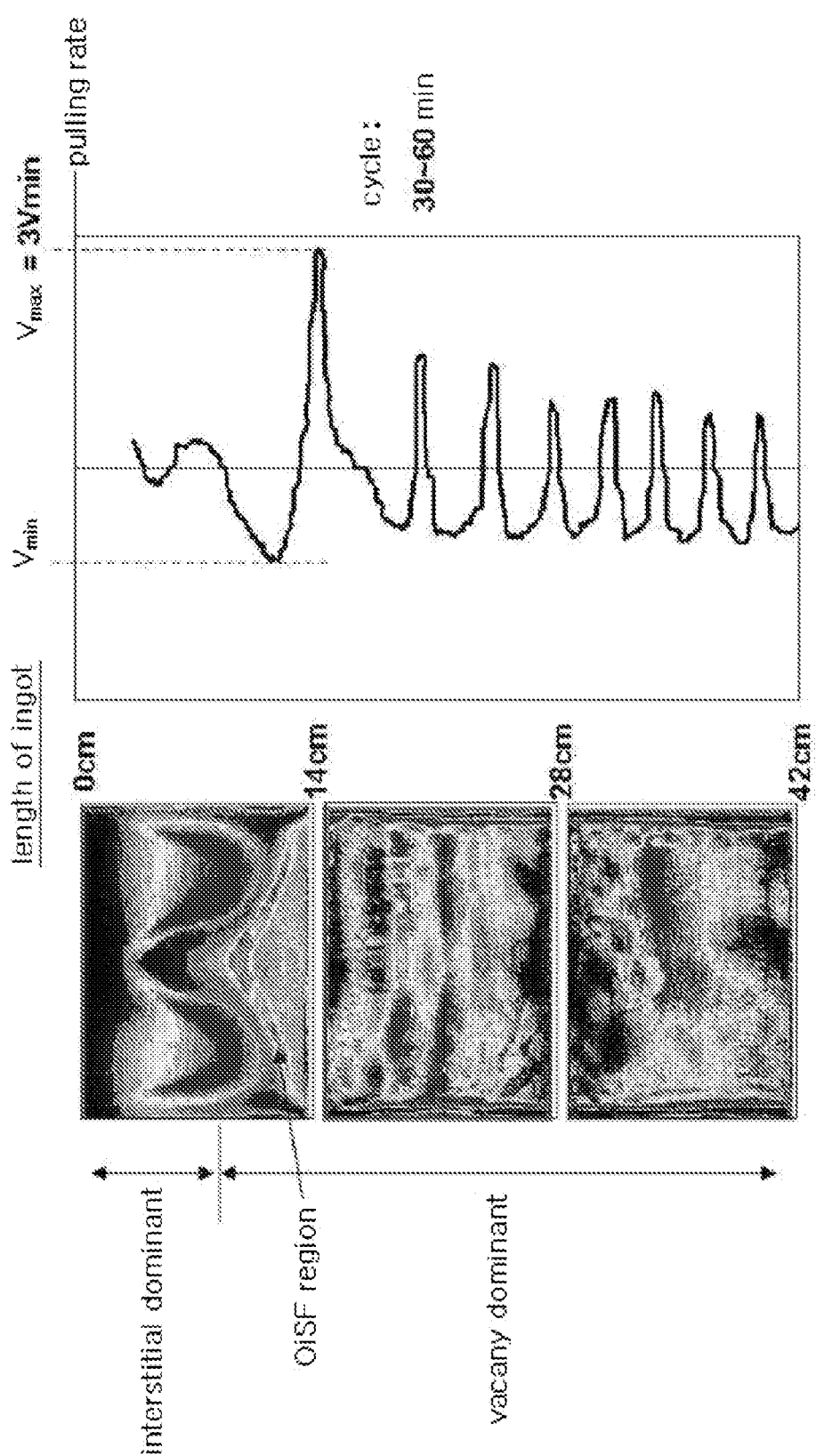
FIG. 6 is a valuation result of crystal defect of silicon single crystal ingot grown by Comparative Example 3.

In addition, crystal defect evaluation results of the Si single crystal ingot grown according to Comparative Example 3 are shown in FIG. 6. In Comparative Example 3, the pulling speed was changed at a period of 30 to 60 minutes, and the fluctuation of the pulling speed was 2 to 3 times of the smallest pulling speed. Despite of such periodic change in the pulling speed, quality result in FIG. 2 shows that the growth rate of high quality single crystal was not improved and high quality was not fully obtained in the radial direction of the ingot with vacancy dominant defects. Even though conventional techniques can be realized, the diameter of a Si single crystal ingot is limited within about 80 mm. In the case of a Si single crystal ingot diameter of 200 mm as in Comparative Example 3, it was impossible to manufacture high quality Si single crystal from solid state diffusion.

As reported in Table 2 above, the temperatures of the Si melt in Comparative Examples 1 to 3 do not comply with conditions proposed by the invention. The temperature of the melt in Comparative Examples 1 to 3 rose continuously in a direction away from the solid-liquid interface until reaching the bottom of the crucible.

When quality evaluation was made on a single crystal ingot after the completion of single crystal growth, Examples 1 to 3 showed 20% improvement over Comparative Example 1 in high quality single crystal growth rate.

FIGS. 7a and 7b and FIGS. 8a to 8d are graphs illustrating the relation of growth rate V/V0 with temperature difference.

FIGS. 7a and 7b and FIGS. 8a to 8d are graphs illustrating the relation between the growth rate V/V0 for high quality Si single crystal and the temperature difference.

Figure 7A:
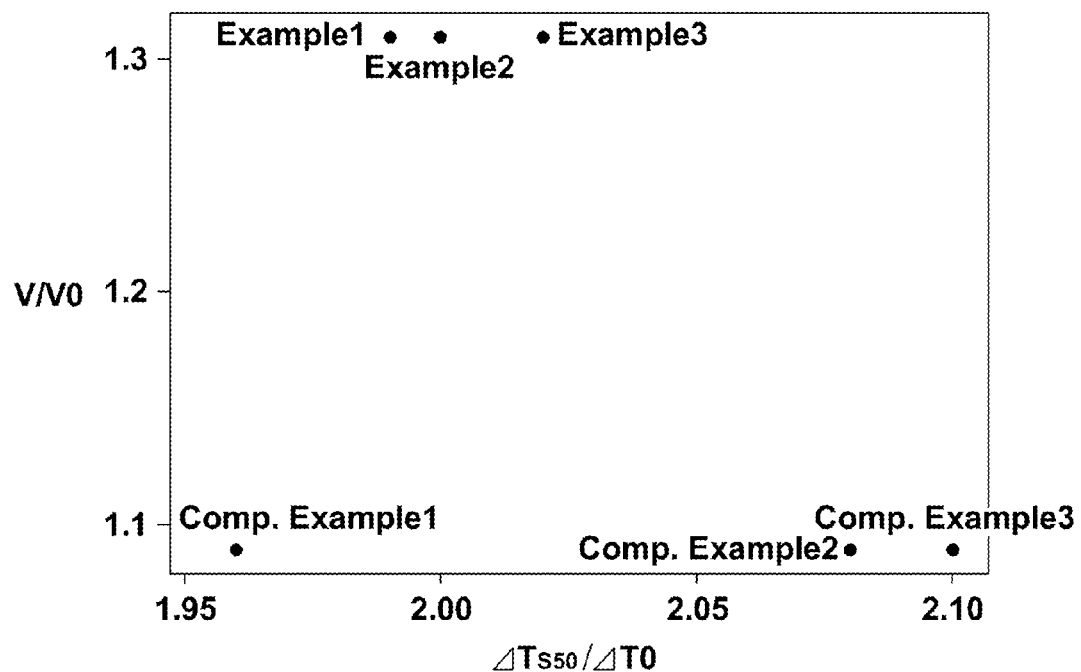
FIGS. 7a and 7b are graphs illustrating the relation between the growth rate for high quality Si single crystal and the temperature difference of Si single crystal, with respect to Examples 1 to 3 and Comparative Examples 1 to 3.
Figure 7B:
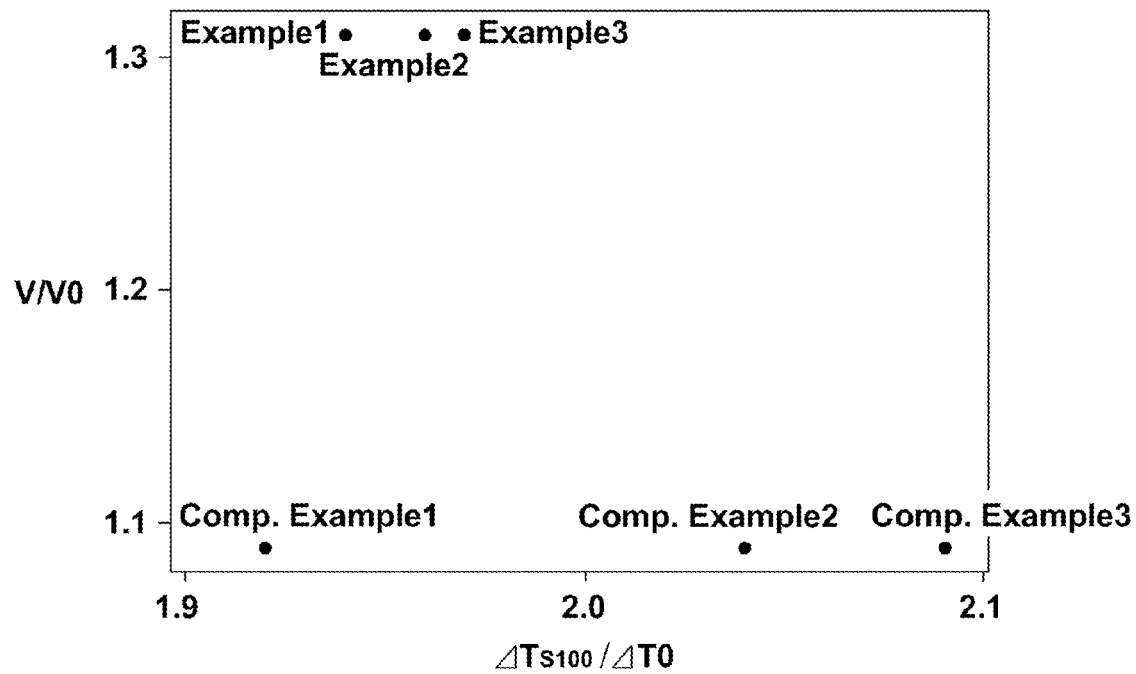

FIG. 7a shows single crystal temperature difference $\Delta T_{s50}/\Delta T0$ between solid-liquid interface and 50 mm point, and FIG. 7b shows single crystal temperature difference $T_{s100}/\Delta T0$ between solid-liquid interface and 100 mm.

Figure 8A:
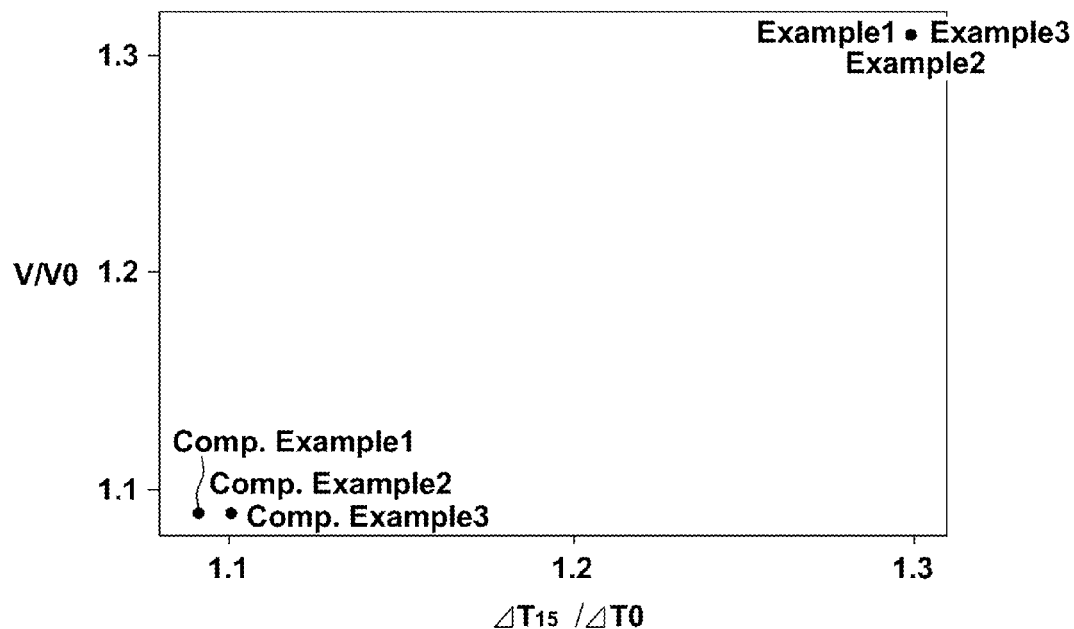
FIGS. 8a to 8d are graphs illustrating the relation between the growth rate for high quality Si single crystal and the temperature difference of Si melt, with respect to Examples 1 to 3 and Comparative Examples 1 to 3.
Figure 8B:
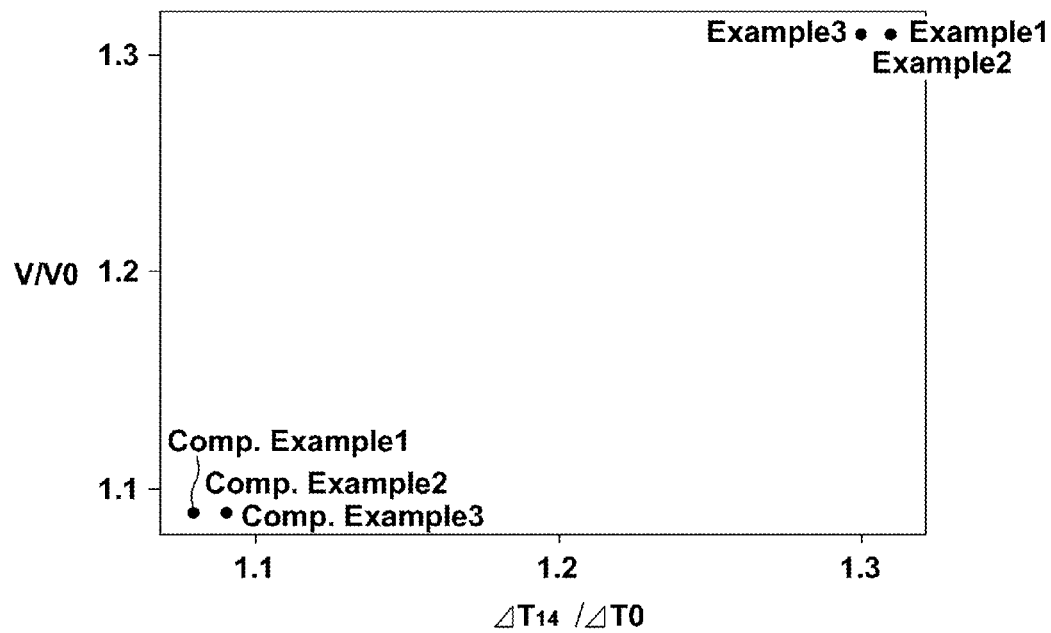
Figure 8C:
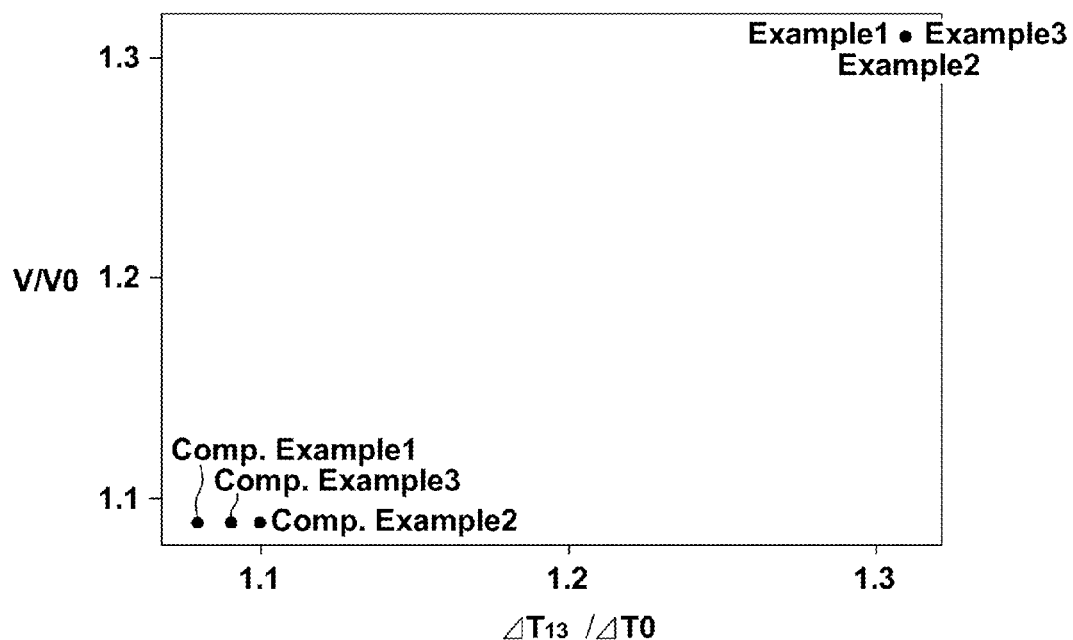
Figure 8D:
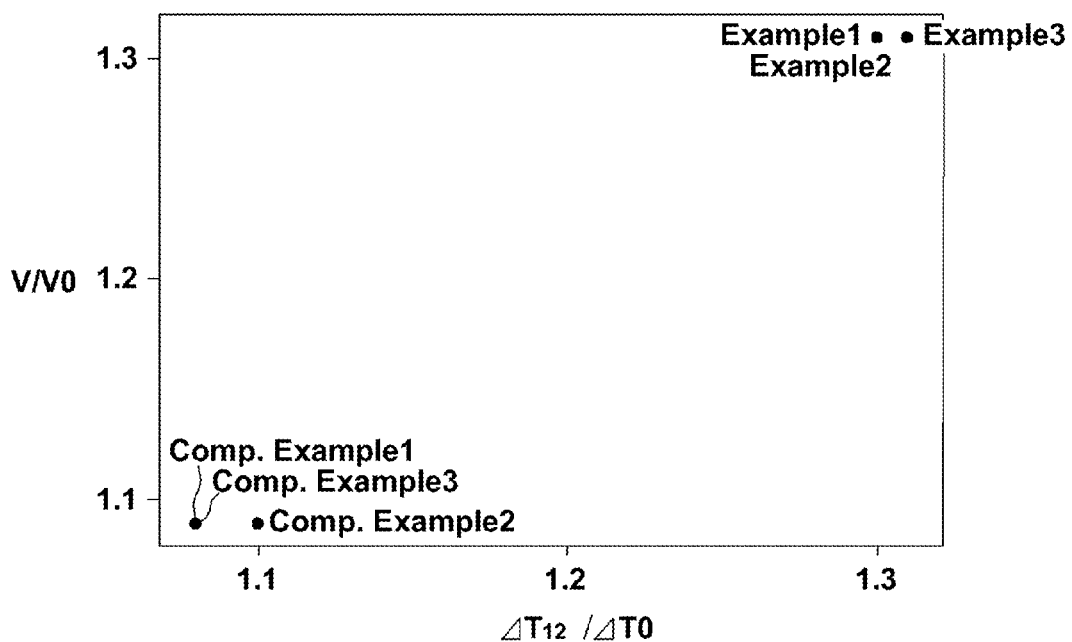

FIG. 8a shows temperature difference $\Delta T_{15}/\Delta T0$ between the solid-liquid interface and 1/5 depth point from the surface with respect to the total depth of the Si melt, and FIG. 8b shows temperature difference $\Delta T_{14}/\Delta T0$ between the solid-liquid interface and 1/4 depth point from the surface with respect to the total depth of the Si melt. FIG. 7c shows temperature difference $\Delta T_{13}/\Delta T0$ between the solid-liquid interface and 1/3 depth point from the surface with respect to the total depth of the Si melt, and FIG. 8d shows temperature difference $\Delta T_{12}/\Delta T0$ between the solid-liquid interface and 1/2 depth point from the surface with respect to the total depth of the Si melt.

In FIGS. 7a and 7b, V/G is not constant, and thus it was found that the growth rate of high quality single crystal is not directly correlated with the temperature difference of crystal.

On the contrary, in FIGS. 8a to 8d, the growth rate of high quality single crystal showed considerable correlation with the temperature gradient of the melt, in which the growth rate divided by the temperature gradient of the melt made a constant value. So, it was found that the temperature gradient of the melt was a decisive factor for growing high quality single crystal, and the growth rates in high quality single crystal in Examples 1 to 3 were improved over Comparative Examples 1 to 3.

By optimizing the temperature distribution of the melt as described above, it was found that high quality single crystal free of crystal defects was obtained easily and growth rate was improved remarkably.

This phenomenon results from the fact that when rising temperature gradient of the melt from the solid-liquid interface to the highest point is made larger, driving force for moving growth units such as atoms and molecules toward crystal growth interface is increased. This as a result can accelerate the pulling speed of crystal or the growth rate of high quality crystal that minimizes point defects such as vacancy and interstitial.

Through heater improvement, magnetic field application and controlled rotation speed of crucible and single crystal as mentioned above, the temperature distribution of the Si melt in single crystal radius direction and single crystal length direction is optimized as described above owing to so-called "channel effect"

Channel effect refers to minimum-loss heat flow from a hottest region toward a high temperature region of the melt along an imaginary channel 100 as shown in FIG. 4. Such channel effect can increase the rising temperature gradient of the melt, that is, the temperature gradient of the melt from the solid-liquid interface to a high temperature region. Besides, the crucible bottom becomes relatively cold thereby restricting oxygen dissolution therefrom.

With the above described means, the invention can control point defects such as vacancy and interstitial, thereby restricting various defects such as dislocation as growth defect (e.g., edge, screw and loop type dislocations), stacking fault and void as a group of vacancies.

As a result, a Si single crystal ingot grown by the apparatus and method as described above has a low point defect concentration of $10^{10} \sim 10^{12}/cm^3$. This point defect concentration corresponds to critical vacancy saturation concentration as a minimum vacancy concentration that can form micro precipitates in an active area of a device during heat treatment in the fabrication of devices from a wafer obtained from the ingot.

Current development in wafer manufacturing technique has achieved defect-free wafer level in as-grown state from low point defect concentration of $10^{11}$ to $10^{13}/cm^3$. However, even a defect-free as-grown wafer having point defect concentration of $10^{11}$ to $10^{13}/cm^3$ creates second defects such as micro precipitates in an active area of a device owing to heat treatment during actual device fabrication from the wafer.

In this way, the invention provides wafers having lower point defect concentration in order to prevent such second defects. The invention can impart high productivity to wafers having point defect concentration at a level the same as or less than critical vacancy saturation concentration that is a minimum vacancy concentration by which micro precipitates can be formed in a device active area during heat treatment.

In this case, heat treatment conditions functioning as reference for defining critical vacancy saturation concentration include first heat treatment carried out at 700 to 800° C. for 5 to 7 hours and second heat treatment carried out at 1000 to 1100° C. for 14 to 18 hours. In addition, micro precipitates are sized 0.3μm or less, and formed inside the wafer at least 1μm deep from the surface of the wafer.

A wafer of the invention having point defect concentration of $10^{10}$ to $10^{12}/cm^3$ as mentioned above does not create secondary defects such as micro precipitates even after undergoing any types of device fabrication processes.

In the past, a central portion of a wafer has been a vacancy dominant region and its periphery was an interstitial dominant region. However, the distribution is currently getting reversed owing to the development of wafer fabrication techniques. Accordingly, also in the present invention, an interstitial dominant region may be formed in a central portion of a Si ingot and a wafer, and a vacancy dominant region may be formed in the periphery. Moreover, even a balanced region is obtained in which interstitial concentration is balanced with vacancy concentration without any interstitial dominant region or vacancy dominant region.

Furthermore, since the invention is based upon fluid mechanism of enhanced turbulent flow, an interstitial dominant region and a vacancy dominant region are found substantially asymmetric about a central axis in the longitudinal direction of an ingot. However, this does not cause any problem in obtaining a high quality single crystal ingot and wafer. That is, in a silicon wafer manufactured according to the invention, the interstitial dominant region and the vacancy dominant region are arranged substantially asymmetric about the center of the wafer. Radial profiles of point defect concentrations are also substantially asymmetric about the center of the wafer.

Furthermore, a Si single crystal ingot and a wafer manufactured according to the invention have uniform point defect distribution. For example, in case of measuring point defect concentration in a region within 90% of the radius from the center of the ingot or wafer, the difference between the maximum point defect concentration Cmax and the minimum point defect concentration Cmin is 10% or less of the minimum point defect concentration Cmin. That is, point defects are distributed uniform satisfying a condition (Cmax−Cmin)/Cmin×100≦10(%).

Generally two types of convection exist in the melt. That is, the convection distribution of the melt SM is divided into an outside portion that rises to the surface of the melt SM along the bottom and sidewall of the crucible and then circulates to the single crystal ingot along the surface of the melt SM and an inside portion that circulates adjacent to the bottom of the single crystal ingot along the inside inclination of the periphery.

Examples of melt convention preferable in the invention are described in detail in Korean Patent Application No. 2003-0080998, by which the quality of single crystal can be made more uniform in its radial direction.

As described above, the invention can control the temperature distribution of the Si melt according to specific conditions proposed by the invention in order to grow a high quality Si single crystal ingot, and owing to high growth rate, achieve high productivity.

Furthermore, the invention has an advantageous effect of providing a high quality Si single crystal ingot and a Si wafer having a low point defect concentration to a level that can prevent secondary defects such as micro precipitates through heat treatments in actual device fabrication.

Using a wafer cut from such a high quality single crystal ingot can enhance the yield of electronic devices.

While the present invention has been shown and described in connection with the preferred embodiments, it will be apparent to those skilled in the art that modifications and variations can be made without departing from the spirit and scope of the invention as defined by the appended claims.

What is claimed is:

1. A method of growing a silicon single crystal from silicon melt by Czochralski method,
   wherein the silicon single crystal is grown according to conditions that the silicon melt has an axial temperature gradient determined according to an equation, $\{(\Delta Tmax - \Delta Tmin)/\Delta Tmin\} \times 100 \leq 10$, wherein ΔTmax is a maximum axial temperature gradient of the silicon melt and ΔTmin is a minimum axial temperature gradient of the silicon melt, when the temperature gradient is measured along an axis parallel to a radial direction of the silicon single crystal.

2. The method according to claim 1, wherein the axial temperature gradient is a mean axial temperature gradient.

3. The method according to claim 1, wherein the axis is a central axis passing through the center of the silicon single crystal.

4. The method according to claim 1, wherein, when the temperature of the silicon melt is measured along an axis parallel to a longitudinal direction of the silicon single crystal, the silicon single crystal is grown according to conditions that the temperature of the silicon melt measured starting with an interface between the silicon melt and the single crystal rises gradually up to a hottest point and then descends gradually as getting away from the silicon single crystal, and the rising temperature gradient of the melt is kept larger than the descending temperature gradient of the melt.

5. The method according to claim 4, wherein the temperature gradient of the silicon melt measured along the axis parallel to the radial direction of the single crystal is taken a portion of the silicon melt ranging from the interface to the hottest point.

6. The method according to claim 4, wherein the axis parallel to the longitudinal direction of the single crystal passes through the center of the silicon single crystal.

7. The method according to claim 4, wherein the hottest point is positioned in a portion of the silicon melt corresponding to ⅕ to ⅔ of the total depth of the silicon melt from the surface.

8. The method according to claim 7, wherein the hottest point is positioned in a portion of the silicon melt corresponding to ⅓ to ½ of the total depth of the silicon melt from the surface.

9. The method according to claim 1, wherein the temperature gradient of the silicon melt measured along the axis parallel to the radial direction of the single crystal is taken from a portion of the melt positioned under the single crystal.

10. The method according to claim 1, wherein the silicon single crystal is grown according to an equation:

$3 \leq Ln[Vs/Vc] \leq 5$, wherein Vc is a rotation speed of a crucible containing the silicon melt and Vs is the rotation of the silicon single crystal.

11. The method according to claim 1, wherein the silicon single crystal is grown from the silicon melt under magnetic field.

12. The method according to claim 11, wherein the magnetic field is applied to the silicon melt in a direction vertical or horizontal to the longitudinal direction of the single crystal, or in CUSP.

13. The method according to claim 11, wherein a heater is provided at sides of the silicon melt to heat the silicon melt so that heat generation in a portion of the silicon melt corresponding to ⅕ to ⅔ of the total depth of the silicon melt from the surface is increased over surrounding portions of the silicon melt.

14. The method according to claim 1, wherein a heater is provided at sides of the silicon melt to heat the silicon melt so that heat generation in a portion of the silicon melt corresponding to ⅕ to ⅔ of the total depth of the silicon melt from the surface is increased over surrounding portions of the silicon melt.

15. A method of growing silicon single crystal from silicon melt by Czochraiski method, wherein the silicon single crystal is grown according to an equation:

$$3 \leq Ln[Vs/Vc]55,$$

wherein Vc is a rotation speed of a crucible containing the silicon melt and Vs is the rotation of the silicon single crystal.

* * * * *